(12) United States Patent
Pendharkar et al.

(10) Patent No.: US 7,745,294 B2
(45) Date of Patent: Jun. 29, 2010

(54) METHODS OF MANUFACTURING TRENCH ISOLATED DRAIN EXTENDED MOS (DEMOS) TRANSISTORS AND INTEGRATED CIRCUITS THEREFROM

(75) Inventors: Sameer Prakash Pendharkar, Allen, TX (US); Binghua Hu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/268,370

(22) Filed: Nov. 10, 2008

(65) Prior Publication Data
US 2010/0117150 A1 May 13, 2010

(51) Int. Cl.
*H01L 21/336* (2006.01)
(52) U.S. Cl. .................. 438/286; 438/306; 438/207; 257/344
(58) Field of Classification Search .......... 438/286, 438/306, 207, 218–219; 257/344, 337, E29.268, 257/E29.269
See application file for complete search history.

(56) References Cited

U.S. PATENT DOCUMENTS 5,304,827 A * 4/1994 Malhi et al. ............... 257/262
6,172,401 B1 * 1/2001 Brand ........................ 257/344

* cited by examiner

*Primary Examiner*—Theresa T Doan
(74) *Attorney, Agent, or Firm*—Warren L. Franz; Wade J. Brady, III; Frederick J. Telecky, Jr.

(57) ABSTRACT

A method of fabricating an integrated circuit (IC) including at least one drain extended MOS (DEMOS) transistor and ICs therefrom includes providing a substrate having a semiconductor surface, the semiconductor surface including at least a first surface region that provides a first dopant type. A patterned masking layer is formed on the first surface region, wherein at least one aperture in the masking layer is defined. The first surface region is etched to form at least one trench region corresponding to a position of the aperture. A dopant of a first dopant type is implanted to raise a concentration of the first dopant type in a first dopant type drift region located below the trench region. After the implanting, the trench region is filled with a dielectric fill material. A body region is then formed having a second dopant type in a portion of the first surface region. A gate dielectric is then formed over a surface of the body region and the first surface region. A patterned gate electrode layer is formed over the gate dielectric, a source region in the body region and a drain region in the first surface region on a side of the trench region opposite to the source are formed, and fabrication of the IC is completed.

19 Claims, 5 Drawing Sheets

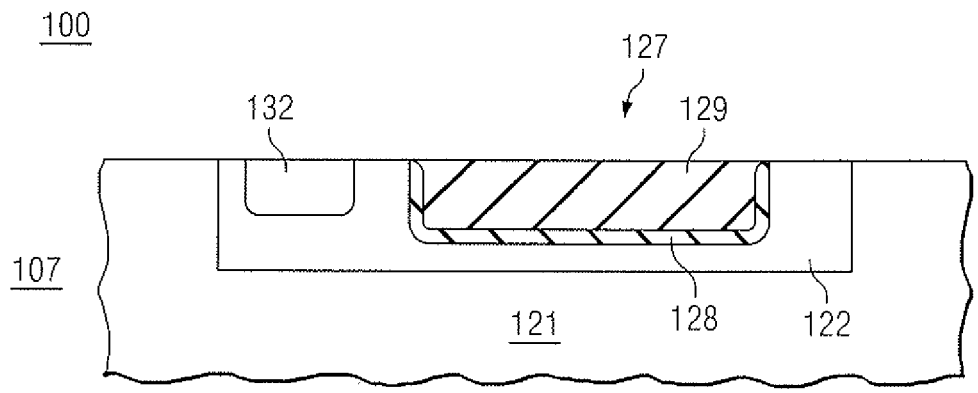
FIG. 1G
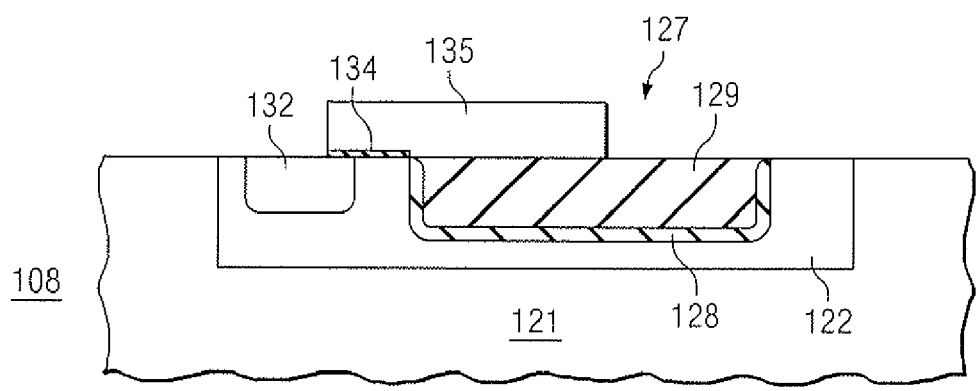
FIG. 1H
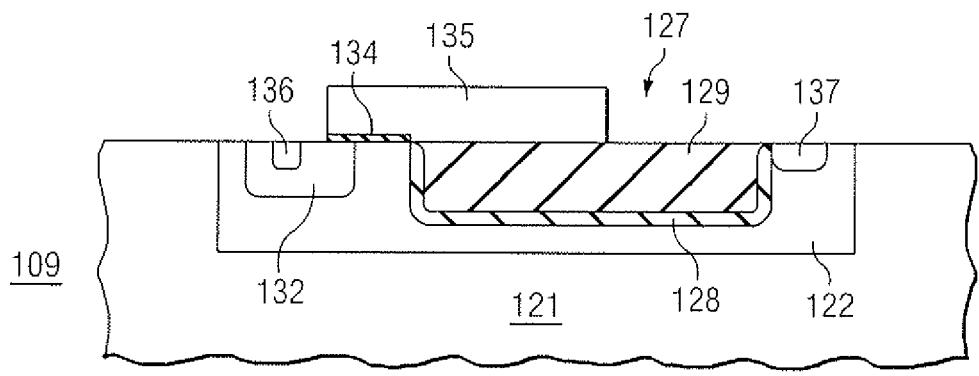
FIG. 1I
COMPLETE IC
110
FIG. 1J

METHODS OF MANUFACTURING TRENCH ISOLATED DRAIN EXTENDED MOS (DEMOS) TRANSISTORS AND INTEGRATED CIRCUITS THEREFROM

FIELD OF THE INVENTION

Embodiments of the present invention relate to methods of manufacturing integrated circuits (ICs) that include high voltage devices, and in particular to methods of manufacturing trench isolated drain extended MOS (DEMOS) transistors and ICs therefrom.

BACKGROUND

Power semiconductor products are often fabricated using N or P channel drain-extended metal-oxide-semiconductor (DENMOS and DEPMOS, respectively) transistor devices, such as lateral diffused MOS (LDMOS) devices, for high power switching applications. DEMOS devices advantageously combine short-channel operation with high current handling capabilities, relatively low drain-source on-state resistance (Rdson), and the ability to withstand high blocking voltages without suffering voltage breakdown failure. Breakdown voltage is typically measured as drain-to-source breakdown voltage with the gate and source shorted together (BVdss).

DEMOS structures generally include thick local oxidation (LOCOS) or trench dielectric in the case of trench isolation (e.g. STI), which protects the gate dielectric edge on the drain side of the device as it would otherwise suffer dielectric breakdown, or progressive degradation during device operation. Since the field oxide thickness is usually limited by technological constraints, higher breakdown voltages typically require more lightly doped layers. However, since Rdson is proportional to the epitaxial layer resistivity, a tradeoff generally results with respect to BVdss, Rdson and BVon (breakdown with high gate-to-source voltage which is a measure of robustness). What is needed is a new process and DEMOS device architecture and/or doping that lessens this tradeoff and thus provides good device performance for BVdss, Rdson and BVon.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

The Present Inventors have realized conventional DEMOS devices formed from LOCOS-based processes have a significant advantage for n-drift surface devices, such as DENMOS devices. As described above, for DEMOS devices such as LDMOS devices it is helpful to have a lower doping level near the surface of the device and higher doping along the field oxide/Si interface "n-drift region" to lessen the tradeoff between BVdss, Rdson and measures of robustness such as BVon. LOCOS processes inherently provide this doping arrangement due to significant n-type dopant (e.g. Phosphorous) pileup during LOCOS oxidation, thus providing a better combination of device characteristics including Rdson/BVdss/BVon due to more optimal dopant profiles resulting from the LOCOS process.

However, for trench isolation based processes (e.g. shallow trench isolation (STI)), n-type dopant pileup is not available to increase the n-type doping along the field oxide/Si interface n-drift region to lessen the tradeoff between BVdss, Rdson and BVon. Significantly, the Present Inventors have recognized that dopant depletion (the opposite of pileup) occurs because the trench etch in trench isolation flows removes dopant during the Si trench etch. Moreover, the Present Inventors have recognized that it is difficult to use an implant to compensate for dopant depletion because selecting a proper implant energy to control the depth of the implant to cluster the dopant near the bottom of the trench in the silicon or other substrate is generally not possible due to the significant trench isolation (e.g. depth) process variability generally present and deep well diffusion requirements for DEMOS devices.

Embodiments of the present invention generally include an additional n-type implant through the trench but before the trench is filled. This implant is hereafter generally referred to as an Rdson reduction implant, due to its significant reduction of Rdson. The Rdson reduction implant boosts the oxide/Si interface n-type concentration in the n-drift region as compared to the n-type dopant concentration at the semiconductor surface under the gate, such as by a factor of at least 3 (three), and generally by a factor of at least 5 (five), thus lowering Rdson. The Rdson reduction implant occurring after trench etch helps reduce dopant sensitivity in the n-drift region due to trench isolation (e.g. STI) depth variation. Moreover, Rdson reduction implants according to embodiments of the invention help keep the surface concentration in the active area low to maintain high BVdss and also be compatible with integration of other devices, such as bipolar devices and conventional MOS devices. Rdson reduction implants according to embodiments of the invention thus significantly improve the trade-off between BVdss, Rdson and BVon. Embodiments of the present invention also satisfy the need for highly robust, low cost (least number of extra masks) power devices that can be integrated with CMOS and other components in a trench isolation (e.g. STI)-based BiCMOS flow. Although generally described for forming DENMOS devices, embodiments of the invention can generally also be applied to DEPMOS devices by appropriate changes to the doping type as known by those having ordinary skill in the art.

BRIEF DESCRIPTION OF THE DRAWINGS

FIG. 1A-J shows resulting intermediate cross sectional depictions associated with an exemplary method for fabricating an integrated circuit (IC) including a plurality of DENMOS devices, according to an embodiment of the invention.

DETAILED DESCRIPTION

Figure 1A:
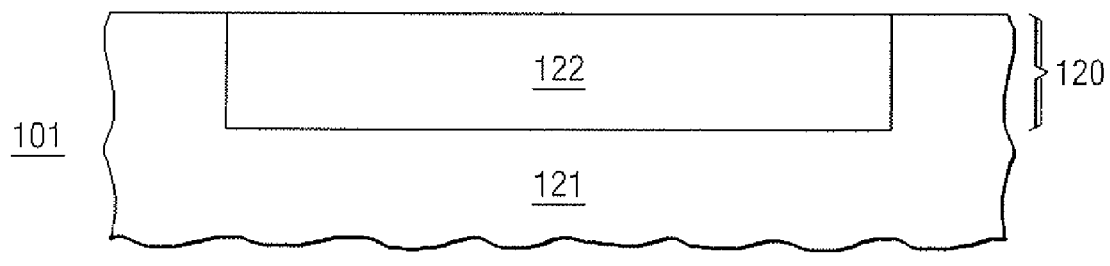

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1A-J shows resulting intermediate cross sectional depictions associated with an exemplary method 100 for fabricating an integrated circuit (IC) including a plurality of DENMOS devices, according to an embodiment of the invention. FIG. 1A shows the resulting cross section after step 101 which comprises providing a substrate 121 having a semiconductor surface 120 comprising at least a first surface region 122 that provides a first dopant type, in this case an n-type dopant. The substrate 121 can comprise a conventional single crystal substrate or a silicon on insulator (SOI) substrate. The substrate 121 can be a p-type substrate or an n-type substrate having a p-epi layer thereon.

Figure 1B:
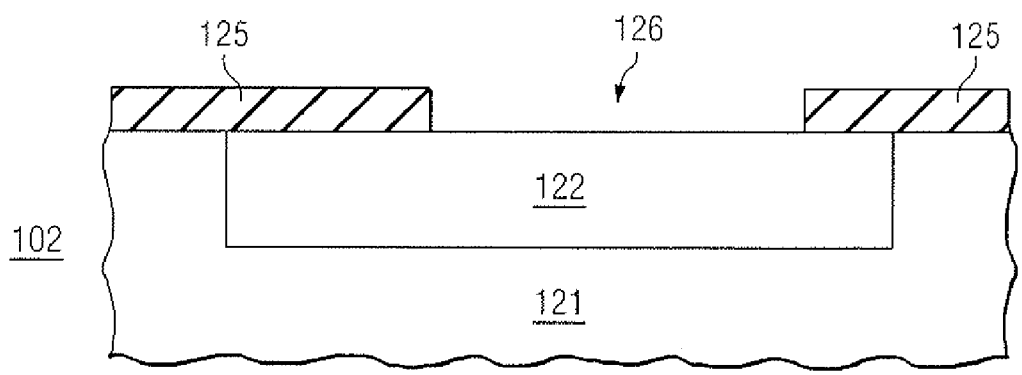

FIG. 1B shows the resulting cross section after step 102 which comprises forming a patterned masking layer 125 on the first surface region 122, wherein at least one aperture 126 in the masking layer 125 is defined. The masking layer 125 can comprise a hard mask material, such as silicon nitride, silicon carbide or silicon oxynitride. The thickness of the hard mask layer 125 is generally 1,500 to 3,000 Angstroms, such around 2,000 A. Although not shown, a thin dielectric layer, such as a thermal oxide layer, is generally formed on the substrate surface before depositing the masking layer 125.

Figure 1C:
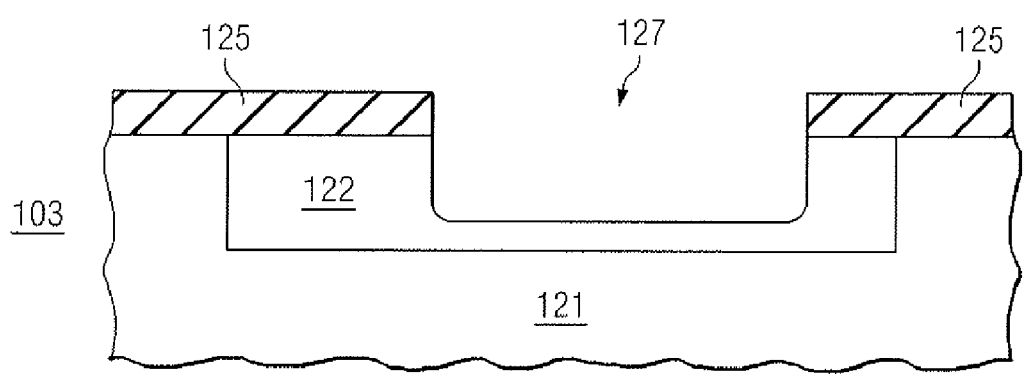

FIG. 1C shows the resulting cross section after step 103. In step 103 the first surface region 122 is anisotropically etched, such as in a RIE etcher, to form at least one trench region 127 corresponding to a position of the aperture 126. As used herein, the term "trench isolation" applies for both conventional (e.g. Si) substrates as well as for SOI substrates. Applied to conventional bulk substrates, as used herein trench isolation includes deep trench isolation which is typically 1-5 μm deep, and shallow trench isolation is typically <1 μm deep, such as 0.3 to 0.7 μm deep. Applied to SOI substrates, as used herein, trench isolation includes the isolation regions between the active area islands. In the case of SOI, the trench isolation regions like in the conventional substrate case are generally filled with a deposited dielectric, but are typically shallower that their conventional substrate counterparts, being generally <0.5 μm deep, such as 0.01 to 0.3 μm deep.

Figure 1D:
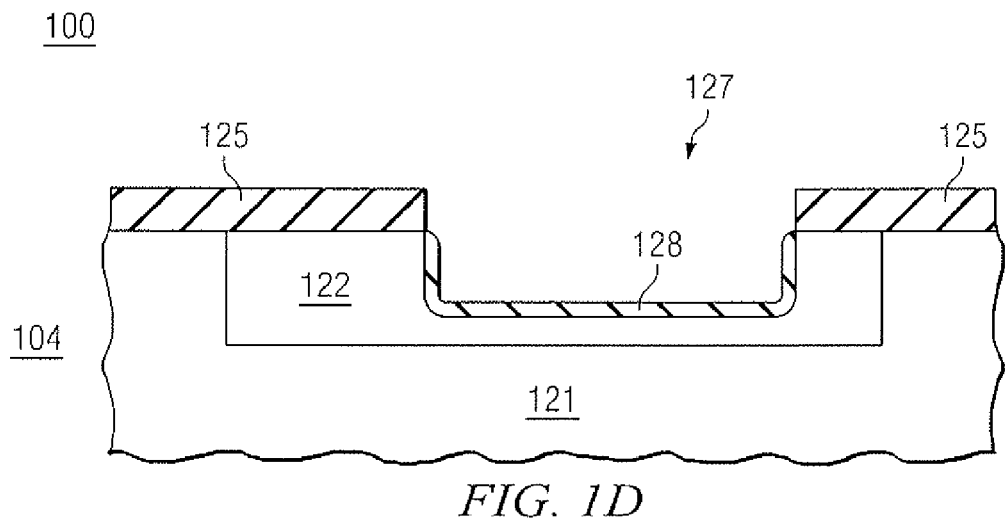

FIG. 1D shows the resulting cross section after step 104 which comprises forming an optional dielectric liner layer 128 on the surface of the trench region 127. The dielectric liner 128 layer can generally comprise a thermal silicon oxide. For example, the dielectric liner 128 can be between 75 and 500 Angstroms thick.

Figure 1E:
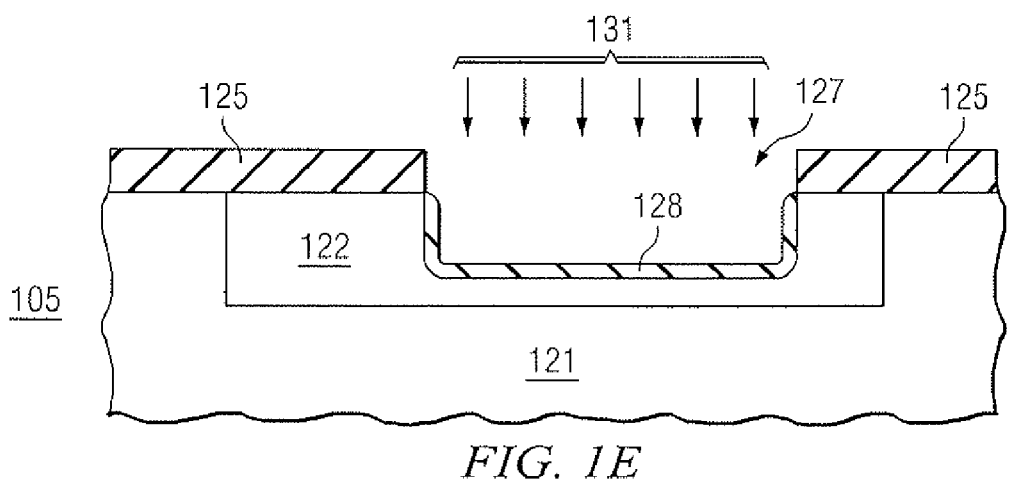

FIG. 1E shows the cross section exposed to step 105 which comprises an Rdson reduction implantation. In step 105 a dopant 131 of the first dopant type, here n-type, is generally blanket implanted to raise a concentration of the first dopant type in a first dopant type drift region portion of surface region 122 located below the dielectric liner layer 128. This increased n-type dopant concentration has been found by the present Inventors to significantly reduce Rdson. Since the blanket implant occurs after the trench etch in step 103, the variation in Rdson is also generally reduced since Rdson is no longer affected by variations in trench isolation depth. The masking layer 125 protects the other areas of the substrate so that the Rdson reduction implant does not go in the active regions. The Rdson reduction implant can comprise implanting an n-type dopant in a dose range from $1 \times 10^{11}$ cm$^{-2}$ to $1 \times 10^{12}$ cm$^{-2}$ at an energy sufficient to place a projected range of the n-type dopant in the first dopant type drift region. The n-type dopant can comprise As, Sb, Bi or in some cases (e.g. low DT cases) P. In one particular embodiment, the n-type dopant comprises As, the dose range is between $2 \times 10^{11}$ cm$^{-2}$ and $8 \times 10^{11}$ cm$^{-2}$ and the implant energy is between 120 to 200 keV. The dose range for the Rdson reduction implant is generally significantly lower as compared to conventional CMOS channel stop implants and accordingly does not generally affect the core CMOS and other components on the IC. However, if required, the channel stop implants can be adjusted to account for this relatively low dose Rdson reduction implant.

Figure 1F:
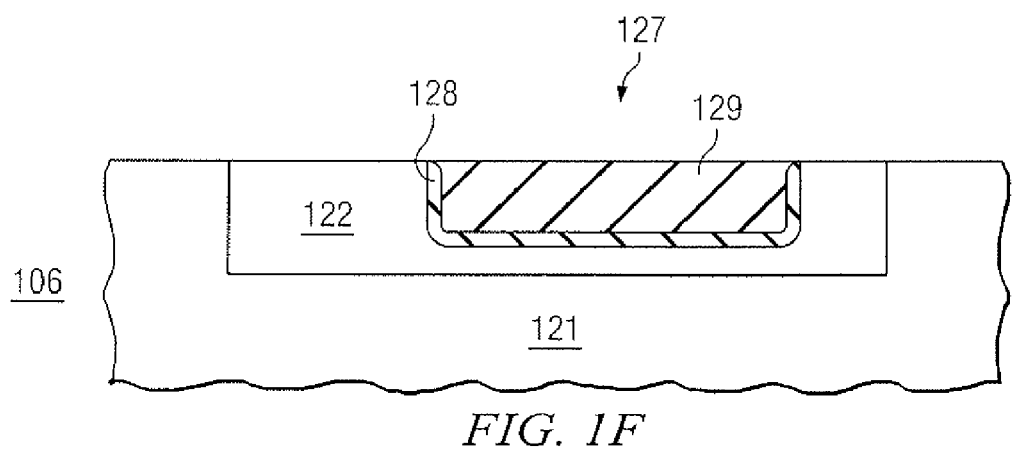

FIG. 1F shows the resulting cross section after step 106 in which the trench region 127 is filled with a dielectric fill material 129, such as a plasma enhanced oxide, the surface planarized, and the masking layer 125 is stripped off. Although not shown, in embodiments of the invention, hard mask (e.g. nitride) pullback processing as known in the art is used to recess the hard mask layer 125 from the edges of trench region 127, before dielectric fill. Such pullback processing as known in the art helps reduce divoting at the trench edges/corners FIG. 1G shows the resulting cross section after step 107 in which a body region 132 having a second dopant type, here p-type, is formed in a portion of the first surface region 122. FIG. 1H shows the resulting cross section after step 108 in which a gate dielectric layer 134 then a patterned gate electrode layer 135 are formed over a surface of the body region 132 and the first surface region 122. In one embodiment the gate electrode layer 135 comprises polysilicon. FIG. 1I shows the resulting cross section after step 109 where a source region 136 is formed in the body region 132 and a drain region 137 is formed in the first surface region 122 on a side of the trench region opposite to the source region 136, both doped with the first dopant type (n-type). FIG. 1J shows step 110 which comprises completion of fabrication of the IC including the completion the plurality of DENMOS transistors.

As described above, method 100 can include formation of DEPMOS devices by generally exchanging the n-type and p-type regions described above. In this case the Rdson reduction implantation generally comprises a p-type dopant such as Ga or In, and in low DT processes can also generally comprise B which can be implanted as BF$_2$. In the case of CMOS ICs, the semiconductor surface 120 will comprise a first surface region 122 having n-type dopant for forming DENMOS and a second surface region having p-type dopant for forming DEPMOS devices.

Advantages of embodiments of the invention include significantly reduced Rdson without significantly degrading BVdss and BVon, and in some cases improving BVdss and/or BVon. Since there is generally no significant thermal processing after the Rdson reduction implant, particularly if the source/drain activation comprises a rapid thermal anneal (RTA) process, the Rdson reduction implant generally stays near to where it is implanted and thus does not diffuse significantly to degrade BVdss and BVon, and in some cases has been found by the Present Inventors to actually improve BVdss and/or BVon, such as described in the Examples below. Moreover, since the Rdson reduction implant occurs after the trench etch in step 103 (see FIG. 1C), the variation in Rdson is also generally reduced since Rdson is no longer affected by variations in trench isolation depth. The low dose for the Rdson reduction implant as compared to conventional CMOS channel stop implants results in the Rdson reduction implant not generally affecting the core CMOS and other components on the IC. Moreover, method 100 only adds one implant to conventional methods and does not generally require any additional masks leading to an economical process flow.

Figure 2:
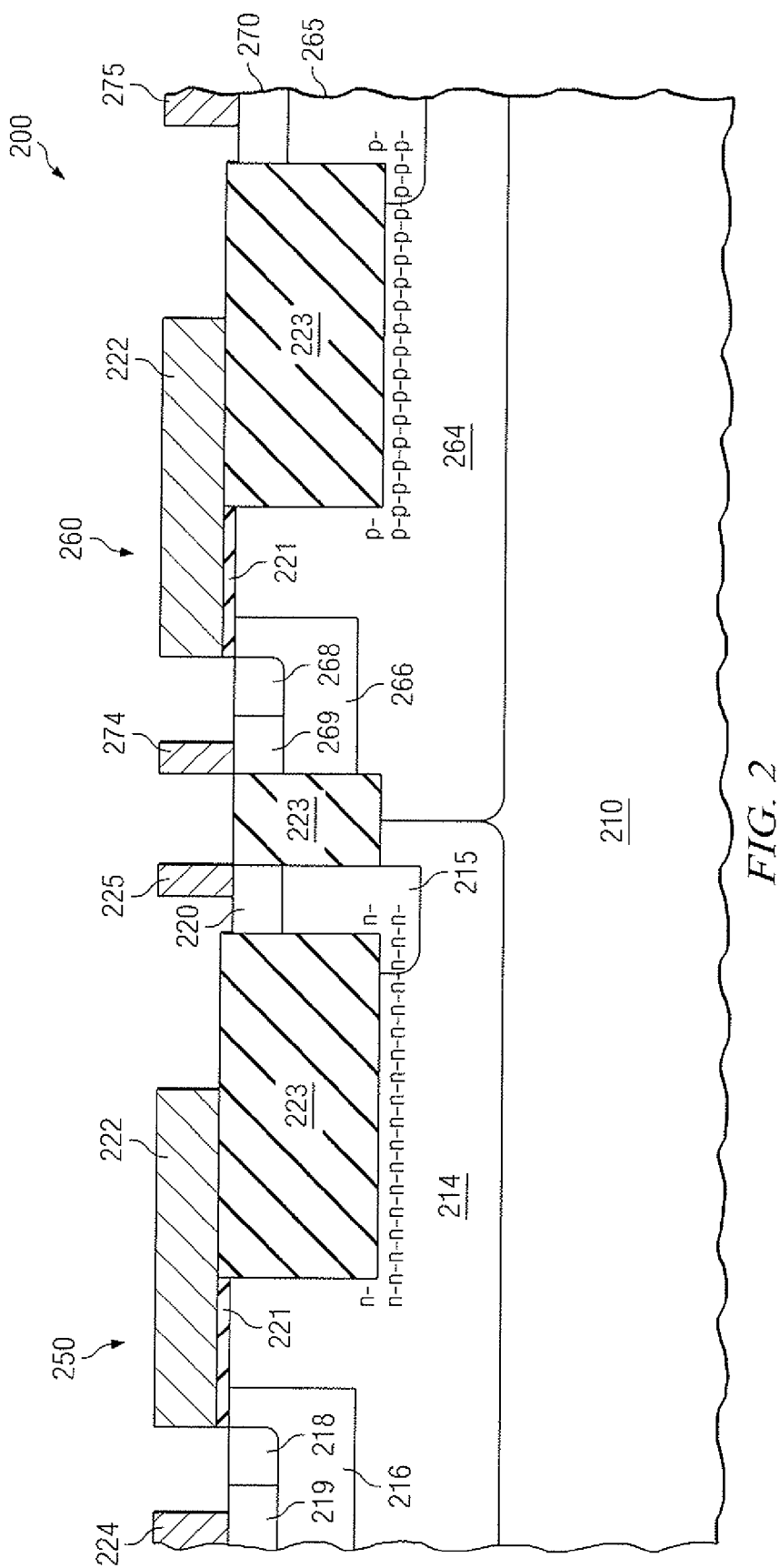
FIG. 2 is a cross sectional view of CMOS IC comprising a DENMOS and a DEPMOS device, according to an embodiment of the invention.

FIG. 2 is a simplified cross sectional view of CMOS integrated circuit (IC) 200 comprising a DENMOS transistor 250 and a DEPMOS transistor 260, according to an embodiment of the invention. Buried layers and silicide layers (e.g. at the contacts and over the gate electrode layer in the case of a polysilicon gate electrode) which may be present are not shown for simplicity. IC 200 comprises a p-type substrate 210. DENMOS transistor 250 includes a deep n-well 214 and an n-type well region of higher doping as compared to n-well 214 referred to as sn-well 215 formed in n-well 214. The sn-well is an optional layer, but can be used as a drain doping buffer improving the Safe-Operating-Area (SOA) for the device under high gate and drain voltage conditions. A p-type body region 216 is formed and at least overlaps a portion of the n-well 214. An n+-type source region 218 and a p+ contact region 219 are formed in p-type body region 216. An n+-type drain region 220 which may be of same doping profile as n+-type source region 218 is formed in sn-well 215.

A gate dielectric layer 221 extends over both a surface portion of p-type body region 216 and the surface of n-well region 214. The gate dielectric generally has a thickness from 300 to 2,000 Angstroms. An electrically conductive gate electrode layer 222 that is generally doped n+ extends over gate dielectric layer 221 and the upper portion of a thick trench isolation layer 223 on the side of its source 218. n-type dopant from an Rdson reduction implant according to an embodiment of the invention is shown in FIG. 2 as "n-" clustered below the trench isolation layer 223 portion having gate electrode layer 222 thereon as shown in FIG. 2. In embodiments of the invention the n-type dopant clustered below the trench isolation layer 223 can primarily comprise As or Sb.

The surface of the p-body region 216 provides the channel region for DENMOS transistor 250. A source electrode 224 is in contact with p+-type contact region 219 and n+-type source contact region 218, and a drain electrode 225 is in contact with n+-type drain contact region 220. Gate electrode layer 222, source electrode 224, and drain electrode 225 are generally electrically isolated from one another by an interlayer dielectric (ILD) film (not shown).

DEPMOS transistor 260 includes a deep p-well 264 and p-type well region of higher doping as compared to p-well 264 referred to as sp-well 265 is formed in p-well 264. An n-type body region 266 is formed and at least overlaps a portion of the p-well 264. A p+-source region 268 and an n+ contact region 269 are formed in n-type body region 266. A p+-type drain region 270 which may be of same doping profile as p+-type source region 268 is formed in sp-well 265. The thin gate dielectric layer 221 extends over both a surface portion of n-type body region 266 and the surface of p-well region 264. An electrically conductive gate electrode layer 222 generally doped p+ extends over gate dielectric layer 221 and the upper portion of a thick trench isolation layer 223 on the side of its source 268. p-type dopant from an Rdson reduction implant according to an embodiment of the invention is shown in FIG. 2 as "p-" clustered below the trench isolation layer 223 portion having gate electrode layer 222 thereon.

The surface of the n-type body region 266 thus provides the channel region for DEPMOS transistor 260. A source electrode 274 is in contact with n+-type contact region 269 and p+-type source contact region 268, and a drain electrode 275 is in contact with p+-type drain contact region 270. Gate electrode layer 222, source electrode 274, and drain electrode 275 are generally electrically isolated from one another by an interlayer dielectric (ILD) film (not shown).

Embodiments of the invention can be integrated into a variety of process flows to form a variety of ICs and related products, such as those for high power switching applications. Exemplary devices and products include ICs including high voltage devices that provide gate to body breakdown voltages >25 Volts, including ICs including double and triple gate comprising ICs that include such high voltage devices.

EXAMPLES

The following non-limiting Examples serve to illustrate selected embodiments of the invention. It will be appreciated that variations in proportions and alternatives in elements of the components shown will be apparent to those skilled in the art and are within the scope of embodiments of the present invention.

Figure 3:
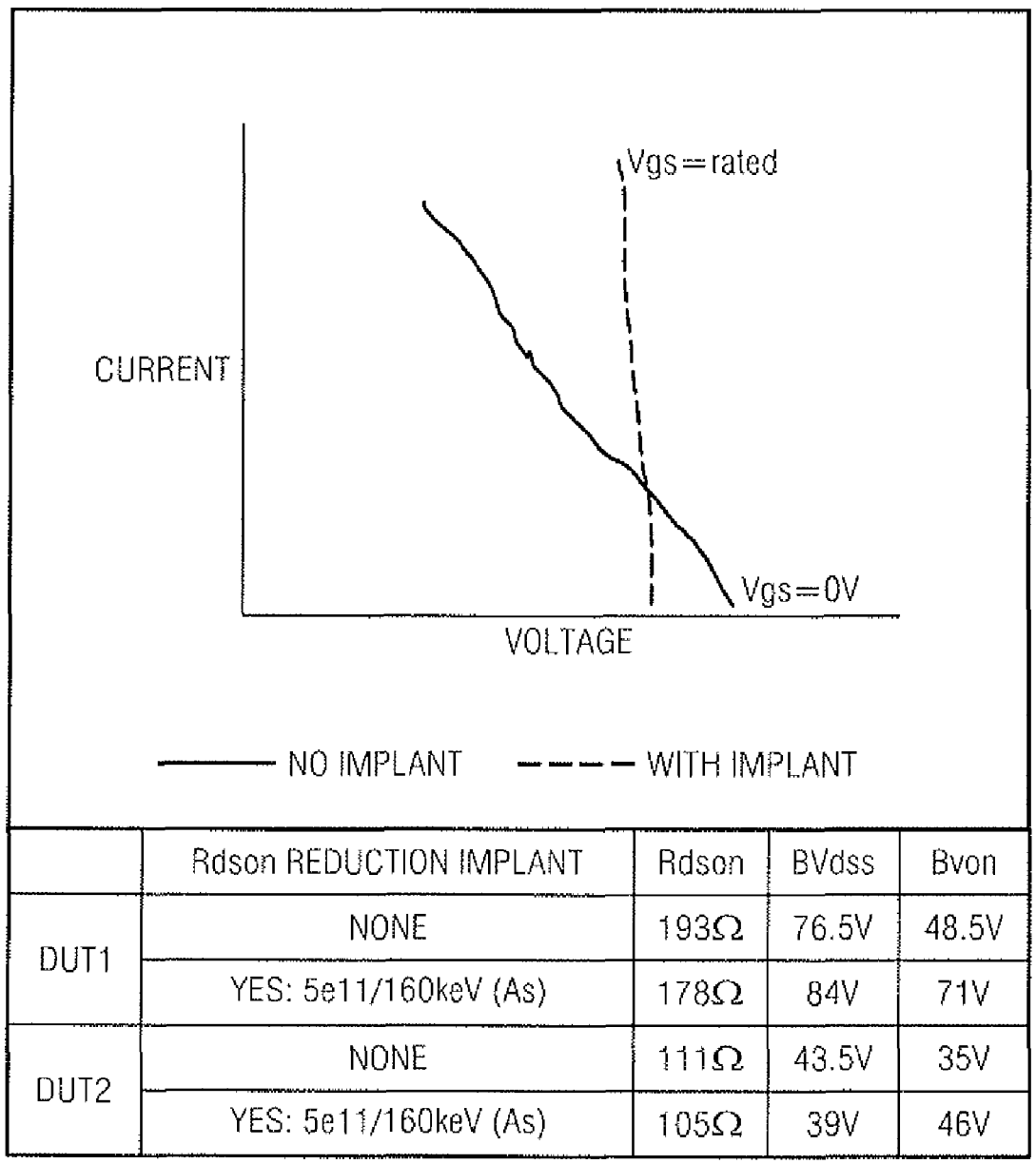
FIG. 3 is a graph of measured current vs. drain-source voltage, and a table showing Rdson, BVdss and BVon from the table for a first conventional DENMOS device with no Rdson reduction implant and a second otherwise equivalent DENMOS device with an exemplary Rdson reduction n-implant according to an embodiment of the invention.

FIG. 3 is a graph of current vs. drain to source voltage for a control DENMOS device (no Rdson reduction implant) and a DENMOS device according to an embodiment of the invention having an Rdson reduction implant. FIG. 3 also includes a data table that provides values for Rdson, BVdss and BVon data from the graph for the control DENMOS device and the DENMOS device according to an embodiment of the invention. The Rdson reduction implant comprised an As dose of $5 \times 10^{11}$ cm$^{-2}$ at 160 keV. The liner oxide through which the implant was performed was around 150 Angstroms. Rdson, BVdss and BVon can all be seen to be significantly improved for the DENMOS device according to an embodiment of the invention as compared to the control DENMOS device.

The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitations. Numerous changes to the disclosed embodiments can be made in accordance with the disclosure herein without departing from the spirit or scope of the invention. For example, the liner dielectric may be omitted. In addition, it may be possible to use high energy implant to perform the Rdson reduction implant after trench filling provided the masking layer is bolstered (e.g. thickened) to increase its stopping power to provide the needed masking function. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of fabricating an integrated circuit including at least one drain extended MOS (DEMOS) transistor, comprising:
   providing a substrate having a semiconductor surface, said semiconductor surface comprising at least a first surface region that provides a first dopant type;
   forming a patterned masking layer on said first surface region, wherein at least one aperture in said masking layer is defined;
   etching said first surface region to form at least one trench region corresponding to a position of said aperture;
   implanting a dopant of said first dopant type to raise a concentration of said first dopant type in a first dopant type drift region of said first surface region located below said trench region;
   after said implanting, filling said trench region with a dielectric fill material;
   forming a body region having a second dopant type in a portion of said first surface region;
   forming a gate dielectric over a surface of said body region and said first surface region;
   forming a patterned gate electrode layer over said gate dielectric;
   forming a source region of said first dopant type in said body region; and
   forming a drain region of said first dopant type in said first surface region on a side of said at least one trench region opposite to said source region.

2. The method of claim 1, further comprising forming a dielectric liner layer on a surface of said trench region before said implanting.

3. The method of claim 2, wherein said dielectric liner layer comprises a thermal silicon oxide that is between 75 and 500 Angstroms thick.

4. The method of claim 1, wherein said at least one drain extended MOS transistor comprises a drain extended NMOS transistor; said
   first dopant type comprises an n-type dopant; and said second dopant type comprises a p-type dopant.

5. The method of claim 4, wherein said implanting comprises implanting an n-type dopant in a dose range of from $1\times10^{11}$ cm$^{-2}$ to $1\times10^{12}$ cm$^{-2}$ at an energy sufficient to place a projected range of said n-type dopant in said first dopant type drift region.

6. The method of claim 5, wherein said n-type dopant comprises As or Sb.

7. The method of claim 5, wherein said n-type dopant comprises As, said dose range is between $2\times10^{11}$ cm$^{-2}$ and $8\times10^{11}$ cm$^{-2}$ and said energy is between 120 to 200 keV.

8. The method of claim 1, wherein said patterned masking layer comprises a hard mask layer, said hard mask layer providing the sole masking during said implanting and wherein said implanting comprises blanket implanting.

9. The method of claim 1, wherein said semiconductor surface comprises said first surface region providing said first dopant and a second surface region providing said second dopant; said at least one drain extended MOS transistor comprises at least one drain extended NMOS transistor formed in said first surface region; and at least one drain extended PMOS transistor is formed in said second surface region.

10. A method of fabricating an integrated circuit including at least one drain extended MOS (DEMOS) transistor, comprising:
    providing a substrate having a semiconductor surface, said semiconductor surface comprising at least a first surface region that provides a first dopant type;
    forming a patterned masking layer on said first surface region, wherein at least one aperture in said masking layer is defined;
    etching said first surface region to form at least one trench region corresponding to a position of said aperture;
    forming a dielectric liner layer on a surface of said trench region;
    implanting a dopant of said first dopant type through said dielectric liner layer to raise a concentration of said first dopant type in a first dopant type drift region of said first surface region located below said trench region;
    after said implanting, filling said trench region with a dielectric fill material;
    forming a body region having a second dopant type in a portion of said first surface region;
    forming a gate dielectric over a surface of said body region and said first surface region;
    forming a patterned gate electrode layer over said gate dielectric;
    forming a source region of said first dopant type in said body region; and
    forming a drain region of said first dopant type in said first surface region on a side of said trench region opposite to said source region.

11. The method of claim 10, wherein said implanting comprises implanting As in a dose range between $2\times10^{11}$ cm$^{-2}$ and $8\times10^{11}$ cm$^{-2}$ and an energy between 120 to 200 keV.

12. The method of claim 10, wherein a concentration of said first dopant type is at least five times greater at said first surface region below said trench region than at said first surface regions below said gate dielectric.

13. The method of claim 10, wherein said dielectric liner layer comprises a thermal silicon oxide that is between 75 and 500 Angstroms thick.

14. The method of claim 10, wherein said semiconductor surface comprises said first surface region providing said first dopant and a second surface region providing said second dopant; said at least one drain extended MOS transistor comprises at least one drain extended NMOS transistor formed in said first surface region; and at least one drain extended PMOS transistor is formed in said second surface region.

15. The method of claim 10, wherein said at least one drain extended MOS transistor comprises a drain extended NMOS transistor; said first dopant type comprises an n-type dopant; and said second dopant type comprises a p-type dopant.

16. The method of claim 15, wherein said implanting comprises implanting As in a dose range between $2\times10^{11}$ cm$^{-2}$ and $8\times10^{11}$ cm$^{-2}$ and an energy between 120 to 200 keV.

17. The method of claim 16, wherein a concentration of said first dopant type is at least five times greater at said first surface region below said trench region than at said first surface regions below said gate dielectric.

18. The method of claim 17, wherein said dielectric liner layer comprises a thermal silicon oxide that is between 75 and 500 Angstroms thick.

19. A method of fabricating an integrated circuit including at least one drain extended NMOS (DENMOS) transistor, comprising:

providing an n-type surface region in a semiconductor surface;

forming a trench region in the first dopant type surface region;

forming a dielectric liner layer on a surface of the trench region;

performing an Rdson reduction implantation of n-type dopant through the dielectric liner layer to raise a concentration of the n-type dopant in an n-type drift region of the n-type surface region below the trench region;

following the Rdson reduction implantation, filling the trench region with dielectric fill material;

forming a p-type body region in a portion of the n-type surface region spaced from the trench region;

forming a gate dielectric over the p-type body region and over the n-type surface region between the p-type body region and the filled trench region;

forming a patterned gate electrode layer over the gate dielectric and over the filled trench region;

forming an n-type source region in the body region; and forming an n-type drain region in the n-type surface region on a side of the trench region opposite to the source region.

* * * * *